United States Patent
Juang et al.

(10) Patent No.: US 9,096,798 B2
(45) Date of Patent: Aug. 4, 2015

(54) PHOSPHOR AND LUMINESCENT DEVICE

(71) Applicant: Chi Mei Corporation, Tainan (TW)

(72) Inventors: Yuan-Ren Juang, Tainan (TW); Jen-Shrong Uen, Tainan (TW)

(73) Assignee: Chi Mei Corporation, Tainan (TW)

( * ) Notice: Subject to any disclaimer, the term of this patent is extended or adjusted under 35 U.S.C. 154(b) by 196 days.

(21) Appl. No.: 13/896,301

(22) Filed: May 16, 2013

(65) Prior Publication Data

US 2014/0175969 A1 Jun. 26, 2014

(30) Foreign Application Priority Data

Dec. 22, 2012 (TW) .............................. 101149282 A

(51) Int. Cl.
*C09K 11/64* (2006.01)
*C09K 11/77* (2006.01)
*H01L 33/50* (2010.01)
*C09K 11/08* (2006.01)

(52) U.S. Cl.
CPC ......... *C09K 11/7728* (2013.01); *C09K 11/0883* (2013.01); *H01L 33/502* (2013.01)

(58) Field of Classification Search
CPC ............. H01L 33/502; C09K 11/0883; C09K 11/7734
USPC ........................ 252/301.4 F; 257/98; 313/503
See application file for complete search history.

(56) References Cited

U.S. PATENT DOCUMENTS

| | | | |
|---|---|---|---|
| 7,229,573 | B2 | 6/2007 | Setlur et al. |
| 8,203,259 | B2 | 6/2012 | Juang et al. |
| 2009/0134359 | A1 | 5/2009 | Watanabe |
| 2009/0283721 | A1* | 11/2009 | Liu et al. ................ 252/301.4 H |
| 2010/0085728 | A1 | 4/2010 | Seto et al. |
| 2012/0126687 | A1 | 5/2012 | Juang et al. |

FOREIGN PATENT DOCUMENTS

| | | |
|---|---|---|
| CN | 1207758 | 2/1999 |
| CN | 101348714 | 1/2009 |
| CN | 101752493 | 6/2010 |
| CN | 102453484 | 5/2012 |
| EP | 0985720 | 1/2004 |
| JP | H11310462 | 11/1999 |
| JP | 2012092006 | 5/2012 |
| WO | 2007004138 | 1/2007 |

* cited by examiner

*Primary Examiner* — Carol M Koslow
(74) *Attorney, Agent, or Firm* — Jianq Chyun IP Office

(57) ABSTRACT

A phosphor and a luminescent device are provided. The phosphor includes a composition represented by following formula (I):

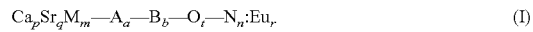

$$Ca_pSr_qM_m-A_a-B_b-O_t-N_n:Eu_r \qquad (I)$$

in the formula (I), M is selected from the group consisting of Mg and Ba; A is selected from the group consisting of Al, Ga, In, Sc, Y, La, Gd and Lu, and A includes at least Al; B is selected from the group consisting of Si, Ge, Sn, Ti, Zr and Hf, and B includes at least Si; O represents oxygen; N represents nitrogen; $0<p<1$, $0<q<1$, $0\le m<1$, $p+q+m\le1.55$, $0\le t\le0.3$, $0.00001\le r\le0.1$, $a=1$, $0.8\le b\le1.2$, and $2.6\le n\le3.1$. The phosphor also contains 10-500 ppm of molybdenum (Mo). Moreover, the luminescent device includes the phosphor containing the composition represented by the formula (I).

16 Claims, 1 Drawing Sheet

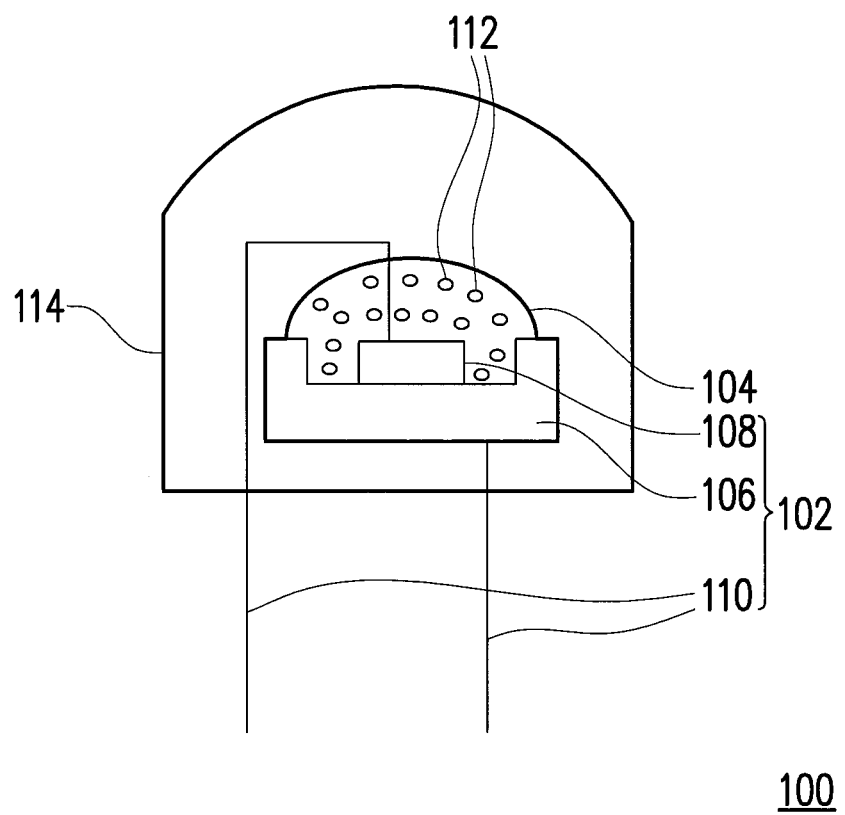

PHOSPHOR AND LUMINESCENT DEVICE

CROSS-REFERENCE TO RELATED APPLICATION

This application claims the priority benefit of Taiwan application no. 101149282, filed on Dec. 22, 2012. The entirety of the above-mentioned patent application is hereby incorporated by reference herein and made a part of this specification.

BACKGROUND OF THE INVENTION

1. Field of the Invention

The present invention generally relates to a light-emitting composition, and more particularly, to a phosphor having high brightness and a luminescent device.

2. Description of Related Art

Light emitting diodes are extensively used in semiconductor-based luminescent devices at present, such luminescent devices are provided with the advantages of high luminescence efficiency, small size, low power consumption and low cost, thus they are applicable for use in various types of light sources. Semiconductor-based luminescent devices comprise a semiconductor light-emitting element and a phosphor, in which the phosphor may absorb and convert the light emitted from the semiconductor light-emitting element. The light emitted from the semiconductor light-emitting element and the light converted and emitted from the phosphor are mixed and utilized. Such luminescent devices are applicable for use in various areas, including fluorescent lamps, vehicles lighting, monitors, backlit liquid crystal displays, and the like. In which, white luminescent devices are the most extensively used.

Current white luminescent devices are assembled by means of a YAG (yttrium aluminum garnet) phosphor ($Y_3Al_5O_{12}$:Ce) with cerium as the active center and a semiconductor light-emitting element emitting blue light. However, using the mixed light emitted from a $Y_3Al_5O_{12}$:Ce phosphor combined with a semiconductor light-emitting element emitting blue light, the color coordinates of the mixed light are positioned on the connecting line between the color coordinates of the blue light emitted from semiconductor light-emitting element and the color coordinates of the light emitted from $Y_3Al_5O_{12}$:Ce phosphor. Hence, the emitted mixed light is white light deficient in red light, and color rendering properties and color saturation are clearly insufficient. In addition, the preferred region of the excitation spectrum of the $Y_3Al_5O_{12}$:Ce and the luminescence region of the semiconductor light-emitting element are inconsistent, thereby causing poor conversion efficiency of excitation light, and a high brightness of white light source is difficult to obtain. In order to resolve such phenomena, YAG:Ce phosphors mixed with phosphors emitting red light have been developed in recent years, and such phosphors include $Sr_2Si_5N_8$:Eu phosphors with europium (Eu) as the active center, $CaAlSiN_3$:Eu phosphors and sialon phosphors are known. However, because the crystal itself has poor heat resisting properties, thus, the $Sr_2Si_5N_8$:Eu phosphor has the disadvantages of decrease in brightness and color rendering properties after long term usage. And, although the sialon phosphor itself has no durability problems, however, luminescence brightness of the phosphor is clearly insufficient, and thus not commercially popular. Although $CaAlSiN_3$:Eu phosphors have preferred durability, and provide better brightness compared to sialon phosphors, however, industries are still expecting further improvement in the luminescence brightness of the phosphor, thereby enabling the luminescent device to be provided with higher luminescence efficiency.

SUMMARY OF THE INVENTION

Accordingly, the present invention provides a phosphor, which can increase luminescence brightness.

The present invention further provides a luminescent device, which can improve luminescence efficiency.

The present invention provides a phosphor comprising a composition represented by a formula (I), and the phosphor contains 10-500 ppm of molybdenum.

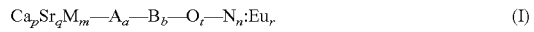
$$Ca_pSr_qM_m—A_a—B_b—O_t—N_n:Eu_r \qquad (I)$$

In the formula (I), M is one of selected from the group consisting of magnesium and barium; A is one of selected from the group consisting of aluminum, gallium, indium, scandium, yttrium, lanthanum, gadolinium and lutetium, and A includes at least Al; B is one of selected from the group consisting of silicon, germanium, tin, titanium, zirconium and hafnium, and B includes at least Si; O represents oxygen; N represents nitrogen; $0<p<1$, $0<q<1$, $0\le m<1$, $p+q+m\le1.55$, $0\le t\le0.3$, $0.00001\le r\le0.1$, $a=1$, $0.8\le b\le1.2$, and $2.6\le n\le3.1$.

In an embodiment of the present invention, the phosphor contains 10-200 ppm of molybdenum.

In an embodiment of the present invention, a raw material of molybdenum in the phosphor is one of selected from the group consisting of an oxygen-containing molybdenum compound, a nitrogen-containing molybdenum compound and a pure metal molybdenum.

In an embodiment of the present invention, the oxygen-containing molybdenum compound comprises $MoO_2$ or $MoO_3$.

In an embodiment of the present invention, $0.05\le p\le0.9$, and $0.1\le q\le0.95$ in the formula (I).

In an embodiment of the present invention, $0.15\le(p+q)<1$ in the formula (I).

In an embodiment of the present invention, the phosphor further comprising at least one element of fluorine, boron, chlorine and carbon, and a content of each of the elements is below 1000 ppm.

In an embodiment of the present invention, the phosphor emits a light with a dominant wavelength of 580-680 nm when excited by 455 nm light source, and a color coordinates (x, y) of the light base on CIE 1931 chromaticity diagram are $0.45\le x\le0.72$, and $0.2\le y\le0.5$.

The present invention further provides a luminescent device comprising a semiconductor light-emitting element and a phosphor. The phosphor is the phosphor as above, wherein the phosphor emits a first light having a dominant wavelength when excited by a second light emitted from the semiconductor light-emitting element, and the dominant wavelength of the first light is different from that of the second light emitted from the semiconductor light-emitting element.

In another embodiment of the present invention, the second light emitted from the semiconductor light-emitting element has a wavelength of 300-550 nm.

In another embodiment of the present invention, the dominant wavelength of the first light is 580-680 nm when excited by the second light having a wavelength of 455 nm, and a color coordinates (x, y) of the first light base on CIE 1931 chromaticity diagram are $0.45\le x\le0.72$, and $0.2\le y\le0.5$.

In view of the above, due to the add of molybdenum, the brightness of the phosphor in the present invention may be higher than that of a phosphor without molybdenum in the same chromaticity. As for the so-called the same chromaticity, it means that the differences of the color coordinates (x,y) are respectively within ±0.002. Furthermore, in the present invention, a higher brightness of the phosphor may be obtained by containing the content of molybdenum within a particular range. According to the present invention, a luminescent device with high brightness may be accomplished by combining such phosphor with a semiconductor light-emitting element.

It is to be understood that both the foregoing general description and the following detailed description are exemplary, and are intended to provide further explanation of the invention as claimed.

BRIEF DESCRIPTION OF THE DRAWINGS

FIG. 1 is a schematic view showing the luminescent device according to an embodiment of the present invention.

DESCRIPTION OF THE EMBODIMENTS

Reference will now be made in detail to the present preferred embodiments of the invention, examples of which are illustrated in the accompanying drawings.

In an embodiment of the present invention, the phosphor comprising a composition represented by the following formula (I):

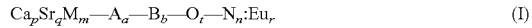
$$Ca_pSr_qM_m—A_a—B_b—O_t—N_n:Eu_r \quad (I)$$

in the formula (I), M is one of selected from the group consisting of magnesium (Mg) and barium (Ba); A is one of selected from the group consisting of aluminum (Al), gallium (Ga), indium (In), scandium (Sc), yttrium (Y), lanthanum (La), gadolinium (Gd) and lutetium (Lu), and A includes at least Al; B is one of selected from the group consisting of silicon (Si), germanium (Ge), tin (Sn), titanium (Ti), zirconium (Zr) and hafnium (Hf), and B includes at least Si; O represents oxygen; N represents nitrogen; $0<p<1$, $0<q<1$, $0 \le m<1$, $p+q+m \le 1.55$, $0 \le t \le 0.3$, $0.00001 \le r \le 0.1$, $a=1$, $0.8 \le b \le 1.2$, and $2.6 \le n \le 3.1$.

In the formula (I), A is one of selected from the group consisting of aluminum, gallium, indium, scandium, yttrium, lanthanum, gadolinium and lutetium, and A includes at least Al. Therefore, A can be exclusively aluminum, or a mixture of aluminum and gallium. In the aforementioned formula (I) B is one of selected from the group consisting of silicon, germanium, tin, titanium, zirconium and hafnium, and B includes at least Si. Therefore, B can be exclusively silicon, or a mixture of silicon and germanium.

Additionally, in the formula (I), the preferred values of p and q are $0.05 \le p \le 0.9$ and $0.1 \le q \le 0.95$. Regarding the relative relationship of the calcium (Ca) and strontium (Sr), it is preferred that $0.15 \le (p+q)<1$. In addition, the preferred value of (p/q) in the formula (I) may be 0.1-10.

Moreover, the phosphor of the present embodiment contains 10-500 ppm of molybdenum, and preferably 10-200 ppm of molybdenum. When the content of molybdenum is below 500 ppm, then the luminescence brightness of the phosphor does not decrease. When the content of molybdenum is above 10 ppm, then there is increase effectiveness in the brightness. A raw material of molybdenum in the phosphor may be one of selected from the group consisting of an oxygen-containing molybdenum compound, a nitrogen-containing molybdenum compound and a pure metal molybdenum, wherein the oxygen-containing molybdenum compound may comprise oxide, carbonate, oxalate and the like. For example, the oxide-containing molybdenum compound is used as the raw material, that is, $MoO_2$ or $MoO_3$, or $MoO_2$ and $MoO_3$ using at the same time.

Similarly, the definition of the "nitrogen-containing molybdenum compound" refers to the compound comprising molybdenum and nitrogen.

Because the phosphor of the present embodiment contains 10-500 ppm of molybdenum, it is found that there is increase effectiveness in the luminescence brightness by experiment. Although it is unable to ascertain the reason why the brightness of the phosphor increases, the present invention is not limited by the following theory. It is inferred that the raw material of molybdenum in the phosphor is converted to liquid state when sintering, and consequently, molybdenum atoms move easily in the liquid state and thereby assist in crystal growth so as to increase crystallinity of crystals, so that the brightness of the phosphor is increased.

When 455 nm light source is used to illuminate the phosphor of the present invention, the phosphor is excited to emit a light and the dominant wavelength of the emitted light is about 580-680 nm, wherein the phosphor having an excitable wavelength region of 250-550 nm. The color coordinates (x,y) of the emitted light base on the CIE 1931 chromaticity diagram are $0.45 \le x \le 0.72$, and $0.2 \le y \le 0.5$, for example. Moreover, the phosphor containing a particular content of molybdenum has a relatively higher brightness compared to a phosphor without molybdenum in the same chromaticity. The so-called "dominant wavelength of the emitted light" refers to the wavelength of the greatest luminescence intensity in the luminescence spectrum.

The composition represented by the formula (I) exists in single phase. However, the synthesis process is affected by factors including proportion of raw materials, addition of flux, impurities in the raw materials, contamination during the processing procedure and volatilization of the raw materials. In addition, it is possibly composed of a single phase but it may be composed of a mixture thereof with the other crystal phases or an amorphous phase. As long as under the prerequisite that the luminescence brightness is not affected, then the aforementioned situation is still in the scope of the present invention.

It is desirable that content of the phosphor of the present embodiment having the same crystal phase as $CaAlSiN_3$ crystal structure, and the content can be 30% or more of the total mass of the phosphor in order to obtain high brightness, preferably 60% or more, and more preferably 90% or more. During practical implementation, an X-ray powder diffraction spectrum can be used to confirm the phosphor contains the same crystal phase as $CaAlSiN_3$ crystal structure, and compare the strongest peaks of the X-ray powder diffraction spectrum with the strongest peaks of other crystal phases to determine the mass proportion of the crystallization phase.

The manufacture of the phosphor of the present embodiment, raw materials of M element (+II valence), A element (+III valence), B element (+IV valence) may be respectively selected from nitrogen-containing compounds, oxygen-containing compounds, or any form of compound or metal. For example, a mixture of $M_3N_2$ and MO may be utilized, or alternatively, a mixture of AN and $B_3N_4$ may be utilized.

The raw material for the phosphor of the present embodiment can be various different forms of precursors, and for the purpose of convenience, a description of an implementation method using nitride raw material is provided hereinafter. Although raw materials of various nitrides of M, A, and B may be commercially available, however, because the higher the purity the better the results, thus, prepare 3N (purity of 99.9%) and above of the raw materials for optimum results.

From the viewpoint of promoting a reaction, it is preferred that the particle of each raw material is minute size. However, due to different particle sizes and shapes of raw materials, thus, the particle sizes and shapes of the phosphors obtained will be different. Hence, all that is needed is to prepare nitride raw material of approximately the same size as those of the final particle size required for the phosphor. The raw material of Eu from commercially available oxide compounds, nitride raw material or metal is preferred. And the higher the purity the better the results, thus, 2N (purity of 99%) and above is preferred, more particularly, the raw material of 3N (purity of 99.9%) and above is the most preferred.

The method of mixing the aforementioned raw materials may be dry method, wet method, or other suitable methods, such as dry ball grinding methods or wet ball grinding methods with liquid, and the present invention is not limited thereto. When weighing out and mixing the easily oxidized compounds such as $Ca_3N_2$, $Sr_3N_2$ or the like, it is more appropriate to carry out within an inactive atmosphere of a glove box. Moreover, because the nitrides of each of the raw materials are easily affected by moisture, thus, it is preferred to use inactive gases that the moisture content has been thoroughly removed. In addition, if pure water is used as a solvent of wet mixing method, the raw materials will be decomposed, and thus, appropriate organic solvents must be chosen. The mixing apparatus can be selected from a conventional ball grinder or a mortar.

When preparing the phosphor, each of the raw materials is mixed according to a specified weighing proportion, placed into a crucible, and the crucible together with the raw materials placed into a high temperature furnace for firing. When firing, the firing temperature is carried out at a high temperature, thus, it is preferred the furnace uses a metal resistor resistive heating type or a graphite resistor resistive heating type. It is preferred that the firing method uses no external mechanical pressure firing methods such as normal pressure firing methods or a gas pressure (using gas compression) firing methods. It is preferred that the crucible is made from high-purity material that does not contain impurities, including crucibles that can be used in an inactive environment, such as a $Al_2O_3$ crucible, $Si_3N_4$ crucible, MN crucible, sialon crucible and a BN (boron nitride) crucible. However, it is preferred that a BN crucible is used to prevent the mixing in of impurities originating from the crucible. The firing atmosphere is nonoxidizing gas, such as nitrogen, hydrogen, ammonia, argon, or a combination of any of the aforementioned gases.

Firing temperature of the phosphor of the present embodiment is above 1200° C. and below 2200° C., more preferred is a temperature of above 1400° C. and below 2000° C., and heating rate is 3-15° C./min. Firing carried out at a relatively low temperature enables obtaining a phosphor of relatively tiny particle size, while firing carried out at a relatively high temperature enables obtaining a phosphor of relatively large particle size. The firing time differs according to the types of raw materials used, but in general, a reaction time is 1-12 hours. Regarding the pressure during firing in an inactive environment, it is preferred that firing is carried out below 0.5 MPa (below 0.1 MPa is especially preferred). After firing is completed, it is cooled to room temperature, and ball grinding, or an industrial pulverizer can be used to pulverize the fired compound, after which washing, filtration, drying and grading steps are carried out, thereby obtaining the phosphor of the present embodiment.

In order to obtain a high brightness phosphor, the amount of impurities contained in the phosphor should be as little as possible. For example, the content of the elements of fluorine, boron, chlorine, carbon and the like are respectively below 1000 ppm, will not affect light emitted.

When the phosphor of the present embodiment is used in powder form, then it is preferred that the average particle diameter of the phosphor powder is below 30 μm, thereby corresponding the surface area of each unit weight of the powder to a desired value, and thus preventing reduction in brightness. When the aforementioned powder is coated on a light-emitting element, then density of the powder can be increased, thereby also preventing reduction in brightness. Moreover, it is known that the preferred average particle diameter is above 1 μm from the viewpoint of the luminescence efficiency of the phosphor powder. According to that described above, it is preferred that the average particle diameter of the phosphor powder is above 1 μm and below 30 μm, more particularly, optimum preference is particle diameter of above 3.0 μm and below 20 μm. So-called "average particle diameter" herein refers to the median value (D50) of the volume-related particle distribution.

FIG. 1 is a schematic view showing the luminescent device according to another embodiment of the present invention.

Referring to FIG. 1, the luminescent device 100 comprises a semiconductor light-emitting element 102 and a luminescent layer 104. In the present embodiment, the semiconductor light-emitting element 102 comprises a conductive base 106, a light emitting diode 108 and a conducting wire 110, but is not limited thereto. The luminescent layer 104 comprises a phosphor 112. In the present embodiment, the phosphor 112 is the phosphor with reference to above embodiment, and thus detailed descriptions thereof are omitted. When the conducting wire 110 is used to transmit externally provided electrical energy to the conductive base 106 and the light emitting diode 108, then the semiconductor light-emitting element 102 emits a light. The phosphor 112 contained in the luminescent layer 104 emits a first light having a dominant wavelength when the phosphor 112 is excited by a second light emitted from the semiconductor light-emitting element 102, and the dominant wavelength of the first light is different from that of the second light emitted from the semiconductor light-emitting element 102. For example, the dominant wavelength of the first light is 580-680 nm when the phosphor 112 is excited by the second light having a wavelength of 455 nm, and a color coordinates (x, y) of the first light base on CIE 1931 chromaticity diagram are $0.45 \leq x \leq 0.72$, and $0.2 \leq y \leq 0.5$. The luminescent device 100 may further comprise an encapsulation structure 114. In the present embodiment, the encapsulation structure 114 covers the semiconductor light-emitting element 102 and the luminescent layer 104.

In the present embodiment, the semiconductor light-emitting element 102 may emit a light of wavelength 300-550 nm, and an ultraviolet (or violet) light of wavelength 330-420 nm or blue light of wavelength 420-500 nm are preferred. For example, the semiconductor light-emitting element 102 can be various types of semiconductors, including zinc sulfide or gallium nitride. And regarding the luminescence efficiency, a gallium nitride semiconductor is preferred.

In the present embodiment, the phosphor 112 in the luminescent device 100 is the phosphor of an embodiment as described above, but the present invention is not limited thereto. In other embodiment, the luminescent layer 104 of the luminescent device 100 may further comprise phosphors provided with other luminescent characteristics to adjust the luminescence region of the luminescent device 100. For example, under the condition of using a ultraviolet semiconductor light-emitting element for providing light with wavelength of 330-420 nm as a excited light source, using a blue light phosphor excited by these wavelengths to emit wavelengths of above 420 nm and below 500 nm, and/or using a green light phosphor excited to provide light with wavelengths of above 500 nm and below 570 nm. Through the appropriate combination, the phosphor is excited, and red, green, blue tricolor light is emitted, which forms a white light luminescent device.

In addition, under the condition of using a blue semiconductor light-emitting element for providing light with wavelength of 420-500 nm as a excited light source, using a yellow phosphor excited by these wavelengths to emit wavelengths of above 550 nm and below 600 nm, which can be assembled with the phosphor of the present invention to emit red and yellow bicolor light. The red and yellow bicolor light is mixed with the blue light emitted from the semiconductor light-emitting element to form a white light or light bulb color illuminating appliance.

Furthermore, under the condition of using a blue semiconductor light-emitting element for providing light with wavelength of 420-500 nm as a excited light source, may further use a green phosphor excited by these wavelengths to emit wavelengths of above 500 nm and below 570 nm, which can be assembled with the phosphor of the present invention to emit red and green bicolor light. The red and green bicolor light is mixed with the blue light emitted from the semiconductor light-emitting element to form a white light illuminating appliance.

The aforementioned luminescent device 100 takes light emitting diode (LED) as an example. However, the phosphor of the present invention is also applicable for use in vacuum fluorescent display (VFD), field emission display (FED), plasma display panel (PDP), and the like.

The following examples are provided to demonstrate the performance of the present invention.

Description of the Measuring Method:

(1) Brightness and color coordinates of the phosphor: light with wavelengths of 455 nm were used to illuminate the phosphor and measurements were carried out by means of a brightness meter, TOPCON SR-3A. Measurement inaccuracy in brightness values were within ±0.3%.

(2) Dominant wavelength of the light emitted from the phosphor: measurements were carried out by means of a Jobin YVON Fluoro Max-3. Dominant wavelength of the emitted light refers to the wavelength of the greatest luminescence intensity when using 455 nm light to excite the phosphor.

(3) Analysis of the elemental composition of the phosphor:

(3-1a) Apparatus: measurements were carried out by means of a Jobin YVON ULTIMA-2, inductively coupled plasma atomic emission spectrometer (ICP).

(3-1b) Sample preprocessing: accurately weigh out 0.1 g of samples, and add in a platinum crucible and then mix evenly with 1 g of $Na_2CO_3$, after which the mixture was fused in a high temperature furnace at 1200° C. (temperature conditions: temperature rises from room temperature to 1200° C. in 2 hours, and then the temperature is maintained for 5 hours). After the mixture has cooled down, add 25 ml of HCl (hydrochloric acid) (36%), and then heat the fuse on a hot plate at 300° C. until clarified. After cooling, place in a 100 ml PFA volumetric flask and add a definite quantity of pure water to a gage mark.

(3-2a) Apparatus: Horiba nitrogen-oxygen analyzer. Model: EMGA-620W.

(3-2b) Measurements: 20 mg of the phosphor was placed into a tin capsule, and then disposed in a crucible for measurements.

EXAMPLE 1

23.016 g of calcium nitride ($Ca_3N_2$) compound, 203.719 g of strontium nitride ($Sr_3N_2$) compound, 106.062 g of aluminum nitride (AlN, purity of 3N), 121.000 g of silicon nitride ($Si_3N_4$, purity of 3N), 3.643 g europium oxide ($Eu_2O_3$, purity of 4N) and 0.138 g of molybdenum dioxide ($MoO_2$ manufactured by Alfa Aesar Company, 99%) are weighed as a raw material, and mixed using a crucible in a glove box under nitrogen. At this time, the weight percentage of molybdenum dioxide is about 0.03 wt %.

The aforementioned mixture is placed in a crucible made of boron nitride (BN), followed by placing the crucible with the mixture therein in a high temperature furnace with highly pure nitrogen atmosphere. The gas flow rate of the nitrogen is 80 liter/min. The temperature is raised to 1800° C. at a heating rate of 10° C./min and maintained at 1800° C. for 8 hours. The operating pressure of the high temperature furnace is maintained at 0.1 MPa to proceed the sintering.

After the sintering, the temperature is cooled to room temperature at a cooling rate of 10° C./min, followed by steps of pulverizing, ball grinding, washing two times, filtration, drying, and grading, so that the phosphor of Example 1 is obtained.

The phosphor of Example 1 is analyzed with inductively coupled plasma atomic emission spectrometer for the content of the molybdenum element. In addition, light with wavelengths of 455 nm is used to illuminate the phosphor and measurements are carried out by means of a brightness meter, TOPCON SR-3A. Measurement inaccuracy in brightness values are within ±0.3%. Measuring results are shown in Table 1. The measured composition proportion of the phosphor in Example 1 is $Ca_{0.197}Sr_{0.684}Al_{1.000}Si_{0.982}N_{2.564}O_{0.213}Eu_{0.005}$.

EXAMPLES 2-6

The method of Example 1 is utilized to prepare the phosphors of Examples 2-6, and the difference is in the change of the weight percentage of molybdenum dioxide ($MoO_2$) as the raw material.

The phosphors of Examples 2-6 are measured by the method of Example 1, and measuring results are shown in Table 1.

EXAMPLE 7

The method of Example 1 is utilized to prepare the phosphor of Example 7, and the difference is in the change of 0.01 wt % of molybdenum trioxide ($MoO_3$ manufactured by Alfa Aesar Company, 99.5%) replacing molybdenum dioxide as the raw material. The phosphor of Example 7 is measured by the method of Example 1, and measuring results are shown in Table 1.

EXAMPLE 8

The method of Example 1 is utilized to prepare the phosphor of Example 8, and the difference is in the change of 0.01 wt % of molybdenum trioxide ($MoO_3$, 99.5%) replacing molybdenum dioxide as the raw material, and the firing time decreases from 8 hours to 4 hours. Similarly, the phosphor of Example 8 is measured by the method of Example 1, and measuring results are shown in Table 1.

EXAMPLE 9

The method of Example 1 is utilized to prepare the phosphor of Example 9, and the difference is in the change of feeding elements and ratio thereof as follows: 4.461 g of magnesium nitride ($Mg_3N_2$) compound, 23.587 g of calcium nitride ($Ca_3N_2$) compound, 195.915 g of strontium nitride ($Sr_3N_2$) compound, 108.692 g of aluminum nitride (AlN, purity of 3N), 124.000 g of silicon nitride ($Si_3N_4$, purity of 3N), 3.733 g europium oxide ($Eu_2O_3$, purity of 4N) and 0.138 g of molybdenum dioxide ($MoO_2$, purity of 2N) are used as the raw material. Then, the method of Example 1 is utilized to prepare the phosphor of Example 9. The phosphor of Example 9 is measured by the method of Example 1, and measuring results are shown in Table 1.

EXAMPLE 10

The method of Example 1 is utilized to prepare the phosphor of Example 10, and the difference is in the change of feeding elements and ratio thereof as follows: 18.819 g of barium nitride ($Ba_3N_2$) compound, 22.826 g of calcium nitride ($Ca_3N_2$) compound, 189.595 g of strontium nitride ($Sr_3N_2$) compound, 105.185 g of aluminum nitride (AlN, purity of 3N), 120.000 g of silicon nitride ($Si_3N_4$, purity of 3N), 3.613 g europium oxide ($Eu_2O_3$, purity of 4N) and 0.138 g of molybdenum dioxide ($MoO_2$, purity of 2N) are used as the raw material. Then, the method of Example 1 is utilized to prepare the phosphor of Example 10. The phosphor of Example 10 is measured by the method of Example 1, and measuring results are shown in Table 1.

COMPARATIVE EXAMPLE 1

The method of Example 1 is utilized to prepare the phosphor of Comparative example 1, and the difference is in the change of no molybdenum dioxide added. The phosphor of Comparative example 1 is measured by the method of Example 1, and measuring results are shown in Table 1.

COMPARATIVE EXAMPLES 2-4

The method of Example 1 is utilized to prepare the phosphors of Comparative examples 2-4, and the difference is in the change of adding amount of molybdenum dioxide. The phosphors of Comparative examples 2-4 are measured by the method of Example 1, and measuring results are shown in Table 1.

ppm of molybdenum, the luminescence brightness of the phosphor can further increase even if the phosphor contains a slight amount of magnesium or barium (Examples 9 and 10). If the content of molybdenum is too high, the inventor infers that a large amount of molybdenum will enter the crystals. Molybdenum elements in the crystals have lower energy level to absorb the energy of the active center Eu. Therefore, the phosphor has lower brightness for the decrease in light emitted.

In summary, according to the present invention, the brightness of the phosphor may be increased in the same chromaticity by controlling the content of Mo within a particular range. In the present invention, such phosphor can be combined with the semiconductor light-emitting element to manufacture the luminescent device having high brightness.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A phosphor, comprising a composition represented by a formula (I):

$$Ca_pSr_qM_m\text{---}A_a\text{---}B_b\text{---}O_t\text{---}N_n:Eu_r \qquad (I)$$

in the formula (I), M is one of selected from the group consisting of magnesium and barium; A is one of selected from the group consisting of aluminum, gallium, indium, scandium, yttrium, lanthanum, gadolinium and lutetium, and A includes at least Al; B is one of selected from the group consisting of silicon, germanium, tin, titanium, zirconium and hafnium, and B includes at least Si; O represents oxygen; N represents nitrogen; $0<p<1$, $0<q<1$, $0\leq m<1$, $p+q+m\leq1.55$, $0\leq t\leq0.3$, $0.00001\leq r\leq0.1$, $a=1$, $0.8\leq b\leq1.2$, and $2.6\leq n\leq3.1$; and the phosphor contains 10-500 ppm of molybdenum.

2. The phosphor according to claim 1, wherein the phosphor contains 10-200 ppm of molybdenum.

TABLE 1

| | Raw material/weight percentage of Mo | Mo content (ppm) | Brightness | Color coordinates x | Color coordinates y | Wavelength (nm) |
|---|---|---|---|---|---|---|
| Comparative Example 1 | None | 0 | 109 | 0.637 | 0.362 | 628 |
| Comparative Example 2 | $MoO_2$ 0.003 wt % | 5 | 109 | 0.637 | 0.362 | 628 |
| Example 1 | $MoO_2$ 0.03 wt % | 48 | 118 | 0.633 | 0.365 | 627 |
| Example 2 | $MoO_2$ 0.006 wt % | 16 | 113 | 0.636 | 0.363 | 628 |
| Example 3 | $MoO_2$ 0.01 wt % | 29 | 116 | 0.635 | 0.364 | 628 |
| Example 4 | $MoO_2$ 0.05 wt % | 133 | 118 | 0.633 | 0.365 | 627 |
| Example 5 | $MoO_2$ 0.06 wt % | 213 | 117 | 0.633 | 0.365 | 627 |
| Example 6 | $MoO_2$ 0.1 wt % | 429 | 116 | 0.632 | 0.366 | 627 |
| Comparative Example 3 | $MoO_2$ 0.13 wt % | 580 | 109 | 0.631 | 0.367 | 627 |
| Comparative Example 4 | $MoO_2$ 0.16 wt % | 831 | 105 | 0.629 | 0.369 | 626 |
| Example 7 | $MoO_3$ 0.01 wt % | 38 | 114 | 0.637 | 0.362 | 628 |
| Example 8 | $MoO_3$ 0.01 wt % | 68 | 113 | 0.635 | 0.364 | 628 |
| Example 9 | $MoO_2$ 0.03 wt % | 55 | 113 | 0.637 | 0.362 | 628 |
| Example 10 | $MoO_2$ 0.03 wt % | 50 | 114 | 0.631 | 0.367 | 627 |

From Table 1, it can be understood that the phosphor containing molybdenum is provided with a relatively higher brightness compared to the phosphor with no molybdenum contained. Moreover, when the phosphor contains 10-500

3. The phosphor according to claim 1, wherein $0.05\leq p\leq0.9$, and $0.1\leq q\leq0.95$ in the formula (I).

4. The phosphor according to claim 3, wherein $0.15\leq(p+q)<1$ in the formula (I).

5. The phosphor according to claim 1, further comprising at least one element of fluorine, boron, chlorine and carbon, and a content of each of the elements is below 1000 ppm.

6. The phosphor according to claim 1, wherein the phosphor emits a light with a dominant wavelength of 580-680 nm when excited by 455 nm light, and a color coordinates (x, y) of the light base on CIE 1931 chromaticity diagram are 0.45≤x≤0.72, and 0.2≤y≤0.5.

7. A luminescent device, comprising:
a semiconductor light-emitting element; and
a phosphor, comprising a composition represented by a formula (I):

$$Ca_pSr_qM_m\text{—}A_a\text{—}B_b\text{—}O_t\text{—}N_n:Eu_r \qquad (I)$$

in the formula (I), M is one of selected from the group consisting of magnesium and barium; A is one of selected from the group consisting of aluminum, gallium, indium, scandium, yttrium, lanthanum, gadolinium and lutetium, and A includes at least Al; B is one of selected from the group consisting of silicon, germanium, tin, titanium, zirconium and hafnium, and B includes at least Si; O represents oxygen; N represents nitrogen; 0<p<1, 0<q<1, 0≤m<1, p+q+m≤1.55, 0≤t≤0.3, 0.00001≤r≤0.1, a=1, 0.8≤b≤1.2, and 2.6≤n≤3.1; and the phosphor contains 10-500 ppm of molybdenum, wherein the phosphor emits a first light having a dominant wavelength when excited by a second light emitted from the semiconductor light-emitting element, and the dominant wavelength of the first light is different from that of the second light.

8. The luminescent device according to claim 7, wherein the second light emitted from the semiconductor light-emitting element has a wavelength of 300-550 nm.

9. The luminescent device according to claim 7, wherein the dominant wavelength of the first light is 580-680 nm when excited by the second light having a wavelength of 455 nm, and a color coordinates (x, y) of the first light base on CIE 1931 chromaticity diagram are 0.45≤x≤0.72, and 0.2≤y≤0.5.

10. The luminescent device according to claim 7, wherein the phosphor contains 10-200 ppm of molybdenum.

11. The luminescent device according to claim 7, wherein 0.05≤p≤0.9, and 0.1≤q≤0.95 in the formula (I).

12. The luminescent device according to claim 11, wherein 0.15≤(p+q)<1 in the formula (I).

13. The luminescent device according to claim 7, wherein the phosphor further comprises at least one element of fluorine, boron, chlorine and carbon, and a content of each of the elements is below 1000 ppm.

14. A phosphor, prepared by mixing a plurality of raw materials, firing the raw materials, and cooling to room temperature after the firing,
wherein the phosphor comprises a composition represented by a formula (I):

$$Ca_pSr_qM_m\text{—}A_a\text{—}B_b\text{—}O_t\text{—}N_n:Eu_r \qquad (I)$$

in the formula (I), M is one of selected from the group consisting of magnesium and barium; A is one of selected from the group consisting of aluminum, gallium, indium, scandium, yttrium, lanthanum, gadolinium and lutetium, and A includes at least Al; B is one of selected from the group consisting of silicon, germanium, tin, titanium, zirconium and hafnium, and B includes at least Si; O represents oxygen; N represents nitrogen; 0<p<1, 0<q<1, 0≤m<1, p+q+m≤1.55, 0≤t≤0.3, 0.00001≤r≤0.1, a=1, 0.8≤b≤1.2, and 2.6≤n≤3.1; and
the phosphor contains 10-500 ppm of molybdenum.

15. The phosphor according to claim 14, wherein the raw materials include a raw material of molybdenum, and the raw material of molybdenum is selected from the group consisting of an oxygen-containing molybdenum compound, a nitrogen-containing molybdenum compound and a pure metal molybdenum.

16. The phosphor according to claim 15, wherein the oxygen-containing molybdenum compound comprises $MoO_2$ or $MoO_3$.

* * * * *